(12) United States Patent
Hung et al.

(10) Patent No.: US 8,599,640 B2
(45) Date of Patent: *Dec. 3, 2013

(54) METHOD AND APPARATUS OF ADDRESSING A MEMORY INTEGRATED CIRCUIT

(71) Applicants: Chun-Hsiung Hung, Hsinchu (TW); Kuen-Long Chang, Taipei (TW); Hsieh Ming Chih, Taipei (TW)

(72) Inventors: Chun-Hsiung Hung, Hsinchu (TW); Kuen-Long Chang, Taipei (TW); Hsieh Ming Chih, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/708,150

(22) Filed: Dec. 7, 2012

(65) Prior Publication Data

US 2013/0094319 A1 Apr. 18, 2013

Related U.S. Application Data

(63) Continuation of application No. 12/769,456, filed on Apr. 28, 2010, now Pat. No. 8,345,505.

(30) Foreign Application Priority Data

Nov. 27, 2009 (TW) .............................. 98140669 A

(51) Int. Cl.
*G11C 8/00* (2006.01)

(52) U.S. Cl.
USPC ................................ 365/230.01; 365/230.06

(58) Field of Classification Search
USPC ........................ 365/230.01, 230.06
See application file for complete search history.

(56) References Cited

U.S. PATENT DOCUMENTS

| | | | | |
|---|---|---|---|---|
| 5,410,308 | A * | 4/1995 | Keesen et al. | 341/60 |
| 6,959,272 | B2 * | 10/2005 | Wohl et al. | 703/20 |
| 6,963,228 | B2 * | 11/2005 | Azam | 326/98 |
| 7,447,235 | B2 * | 11/2008 | Luby et al. | 370/476 |
| 2006/0112326 | A1 * | 5/2006 | Lee et al. | 715/500.1 |
| 2007/0217271 | A1 * | 9/2007 | Kutz et al. | 365/189.09 |
| 2008/0106967 | A1 * | 5/2008 | Oh | 365/230.06 |
| 2008/0263334 | A1 * | 10/2008 | Synder et al. | 712/221 |
| 2010/0079162 | A1 * | 4/2010 | Srinath et al. | 324/763 |

* cited by examiner

*Primary Examiner* — Michael Tran
(74) *Attorney, Agent, or Firm* — Kenta Suzue; Haynes Beffel & Wolfeld LLP

(57) ABSTRACT

A memory integrated circuit has control circuitry that accesses memory cells of the memory integrated circuit. The control circuitry is responsive to commands including a first command and a second command. The first command specifies a high order set of address bits. The second command specifies a low order set of address bits. The high order set of address bits and the low order set of address bits constitute a complete access address of the memory integrated circuit. The first command and the second command have different in command codes.

20 Claims, 7 Drawing Sheets

| 1st byte | 2nd byte | 3rd byte | 4th byte |
|---|---|---|---|
| Command xxH | AD1 A23~A16 | AD2 A15~A8 | AD3 A7~A0 |

Fig. 1A

| 1st byte | 2nd byte | 3rd byte | 4th byte | 5th byte |
|---|---|---|---|---|
| Command xxH | AD1 A31~A24 | AD2 A23~A16 | AD3 A15~A8 | AD4 A7~A0 |

Fig. 1B

| Single word mode | 1st byte | 2nd byte | 3rd byte | 4th byte |
|---|---|---|---|---|
| Input command cycle | Command xxH | AD2 A24~A17 | AD3 A16~A9 | AD4 A8~A1 |

Fig. 2A

| Double word mode | 1st byte | 2nd byte | 3rd byte | 4th byte |
|---|---|---|---|---|
| Input command cycle | Command xxH | AD2 A25~A18 | AD3 A17~A10 | AD4 A9~A2 |

Fig. 2B

| Quad word mode | 1st byte | 2nd byte | 3rd byte | 4th byte |
|---|---|---|---|---|
| Input command cycle | Command xxH | AD2 A26~A19 | AD3 A18~A11 | AD4 A10~A3 |

Fig. 2C

| 1st byte | 2nd byte | 3rd byte | 4th byte |
|---|---|---|---|
| High address command xxH | AD1 A31~A24 | Don't care | Don't care |

Fig. 3A

| 1st byte | 2nd byte | 3rd byte | 4th byte |
|---|---|---|---|
| Low address command xxH | AD1 A23~A16 | AD2 A15~A8 | AD3 A7~A0 |

Fig. 3B

| CS1 | CS0 | Starting Array bank # |
|---|---|---|
| 0 | 0 | 0 then 1 and loop whole array |
| 0 | 1 | 1 and loop 1 |
| 1 | 0 | 0 and loop 0 |
| 1 | 1 | Non-select |

METHOD AND APPARATUS OF ADDRESSING A MEMORY INTEGRATED CIRCUIT

RELATED APPLICATIONS

This application is a continuation of U.S. Pat. No. 8,345,505, issued on 1 Jan. 2013 which claims priority under 35 U.S.C. 119 to Taiwanese Application No. 098140669, filed 27 Nov. 2009. Both applications are incorporated herein by reference.

BACKGROUND

1. Field

The technology relates to addressing the memory on an integrated circuit, such as serial flash memory.

2. Description of Related Art

Serial flash is a flash memory type with a serial interface standard such as Serial Peripheral Interface (SPI). Sequential data communication occurs in compliance with the serial interface. Such a serial device requires fewer external pins than a parallel interface device having a memory of comparable size. For example, to communicate a 24 bit memory address specifying about 16 million memory locations of an 8 bit byte in a 128 megabit memory, a serial flash device compliant with the SPI standard communicates the 24 bit memory address serially through an input pin, rather than in parallel through 24 input pins.

Conventional serial flash uses a 24-bit address stream through the input pin or pins for accessing a memory space up to 128 megabits. Because the number of address bits is a limitation on the addressable memory space, when each addressable location stores an 8 bit byte, the 24-bit address limits the storage capacity to 128 megabits, limiting potential applications.

However, modification of a memory device to expand the range of addressable memory is discouraged, in that any such modification which "breaks" compliance of a memory device with a common standard such as SPI, or with an existing instruction set used with existing products of a company, would result in a burden on existing users already familiar with the common standard or existing instruction set. Accordingly, this adds difficulty to the expansion of the capacity of a memory device.

SUMMARY

A new interface for integrated circuit memory, such as serial flash, is provided that has the capability of accessing a memory space greater than the conventional serial flash memory space of 128 megabits, while maintaining compatibility with the existing serial flash specification of SPI.

Embodiments of the present technology implement various memory addressing interfaces for high density memory, such as serial flash memory. Compatibility is maintained with standards for lower capacity memory, while working around the limited size of an address in existing memory instructions with the single address input pin of serial flash memory.

One aspect of the technology is a memory integrated circuit, with control circuitry. The control circuitry accesses memory cells of the memory integrated circuit. The control circuitry is responsive to commands including a first command and a second command. The first command specifies a high order set of address bits. The second command specifies a low order set of address bits. The high order set of address bits and the low order set of address bits constitute a complete access address of the memory integrated circuit. The first command and the second command have different in command codes.

Another aspect of the technology is a method of accessing a memory integrated circuit, comprising:

communicating, with the memory integrated circuit, a first command specifying a high order set of address bits; and communicating, with the memory integrated circuit, a second command specifying a low order set of address bits, the high order set of address bits and the low order set of address bits constituting a complete access address of the memory integrated circuit, wherein the first command and the second command have different command codes.

One aspect of the technology is an apparatus, with a memory integrated circuit. The memory integrated circuit has multiple groups of memory cells, and control circuitry.

A first group of memory cells has a first group of memory locations. Low memory addresses, having a number of low memory address bits, distinguish particular memory locations from among the first group of memory locations.

A second group of memory cells has a second group of memory locations. Low memory addresses, having the number of low memory address bits, distinguish particular memory locations from among the second group of memory locations.

The control circuitry accesses the first group of memory cells and the second group of memory cells. The control circuitry is responsive to instructions, including at least a memory access instruction and an address instruction. The memory access instruction and the address instruction are separate instructions.

The memory access instruction has a memory access operation code and a low memory address having the number of low memory address bits.

The address instruction includes a high address operation code and a high memory address having a number of high memory address bits. The high memory address distinguishes whether the memory access instruction is applied to the first plurality of memory cells. In some embodiments, the high memory address distinguishes between the first group of memory cells and the second group of memory cells.

The difference in the terms "high memory address" and "low memory address" refer to the different uses of the memory addresses as claimed, and not to the precise positions of the various memory bits in a complete memory address combining the high memory address and the low memory address.

In some embodiments, the memory integrated circuit includes additional groups of memory cells having additional groups of memory locations. Low memory addresses, having the number of low memory address bits, distinguish particular memory locations from among an additional group of memory locations within a particular additional group of memory cells. In one embodiment, the high memory address distinguishes among the first group of memory cells, the second group of memory cells, and the additional groups of memory cells.

In some embodiments, the high memory address of the address instruction distinguishes between the first group of memory cells and the second group of memory cells, for the memory access instruction occurring after the address instruction.

In some embodiments, the memory integrated circuit is a serial flash integrated circuit.

One aspect of the technology is a method of accessing a memory integrated circuit, comprising the following steps:

communicating, with the memory integrated circuit, a memory access instruction including a memory access operation code and a low memory address having a number of low memory address bits, wherein the low memory address is sufficient to distinguish particular memory locations from among a first plurality of memory locations of a first plurality of memory cells on the memory integrated circuit, and the low memory address is sufficient to distinguish particular memory locations from among a second plurality of memory locations of a second plurality of memory cells on the memory integrated circuit; and communicating, with the memory integrated circuit, an address instruction including a high address operation code and a high memory address having a number of high memory address bits, the high memory address distinguishing whether the memory access instruction is applied to the first plurality of memory cells, wherein the memory access instruction and the address instruction are separate instructions.

Other embodiments are disclosed herein.

One aspect of the technology is an apparatus, with a memory integrated circuit. The memory integrated circuit has multiple groups of memory cells, control circuitry, and multiple sets of pins.

A first group of memory cells has a first group of memory locations. Low memory addresses, having a number of low memory address bits, distinguish particular memory locations from among the first group of memory locations.

A second group of memory cells have a second group of memory locations. Low memory addresses, having the number of low memory address bits, distinguish particular memory locations from among the second group of memory locations.

The control circuitry accesses the first group of memory cells and the second group of memory cells. The control circuitry is responsive to instructions, including at least a memory access instruction. The memory access instruction includes a memory access operation code and a low memory address having the number of low memory address bits.

A first set of pins serially communicates the memory access instruction and the low memory address.

A second set of pins communicates a high memory address having a number of high memory address bits. According to the high memory address communicated by the second set of pins, the control circuitry determines whether to apply the memory access instruction to the first group of memory cells.

In some embodiments, the first group of memory cells and the second group of memory cells are continuously accessed, such that after reaching a last low memory address of one of the first group of memory cells and the second group of memory cells, the other of the first group of memory cells and the second group of memory cells is accessed.

In some embodiments, the first group of memory cells is accessed by looping, such that after reaching a last low memory address of the first group of memory cells, a beginning address of the first group of memory cells is accessed. In one embodiment, the second group of memory cells is accessed by looping, such that after reaching a last low memory address of second group of memory cells, a beginning address of the second group of memory cells is accessed.

In some embodiments, the high memory address distinguishes between the first group of memory cells and the second group of memory cells.

In some embodiments, the memory integrated circuit includes additional groups of memory cells having additional groups of memory locations. Low memory addresses, having the number of low memory address bits, distinguish particular memory locations from among an additional group of memory locations within a particular additional group of memory cells. In one embodiment, the high memory address distinguishes among the first group of memory cells, the second group of memory cells, and the additional groups of memory cells.

In some embodiments, the memory integrated circuit is a serial flash integrated circuit.

One aspect of the technology is a method of accessing a memory integrated circuit, comprising the following steps:

serially communicating with the memory integrated circuit, via a first set of pins of the memory integrated circuit, a memory access instruction including a memory access operation code and a low memory address having a number of low memory address bits, wherein the low memory address is sufficient to distinguish particular memory locations from among a plurality of memory locations of a first plurality of memory cells on the memory integrated circuit, and the low memory address is sufficient to distinguish particular memory locations from among a second plurality of memory locations of a second plurality of memory cells on the memory integrated circuit; and communicating with the memory integrated circuit, via a second set of pins of the memory integrated circuit, a high memory address having a number of high memory address bits, wherein, the high memory address communicated by the second set of pins determines whether the memory access instruction is applied to the first plurality of memory cells.

Another aspect of the technology is an integrated circuit, comprising:

a plurality of memory cells divided into in a plurality of banks;

a first set of one or more pins that receive a signal indicating a set of low order memory address bits; and a second set of one or more pins that receive a signal indicating a set of high order memory address bits, the set of low order memory address bits and the set of high order memory address bits in combination identifying memory cells to access.

In one embodiment the set of high order memory address bits indicate the addresses of a bank.

Other embodiments are disclosed herein.

BRIEF DESCRIPTION OF THE DRAWINGS

FIG. 1A is a memory instruction with a memory access operation code and a 3 byte address.

FIG. 1B is a memory instruction with a memory access operation code and a 4 byte address.

FIG. 2A is a memory instruction with a memory access operation code specifying single word access, and one address bit specifying two bytes of data (single word access), eliminating one potential address bit which would otherwise have to be communicated.

FIG. 2B is a memory instruction with a memory access operation code specifying the address for the double word access, and two address bits specifying four bytes of data (double word access), eliminating two potential address bits which would otherwise have to be communicated.

FIG. 2C is a memory instruction with a memory access operation code specifying the address for the quadruple word access, and three address bits specifying eight bytes of data (quadruple word access), eliminating three potential address bits which would otherwise have to be communicated.

FIG. 3A is a memory instruction with a memory access operation code to specify a high order address, and a single byte address and two don't care bytes specifying the high memory address portion of a memory address.

FIG. 3B is a memory instruction with a memory access operation code to specify a low order address, and a 3 byte address specifying the low order address portion of a memory address.

DETAILED DESCRIPTION

Figure 4:
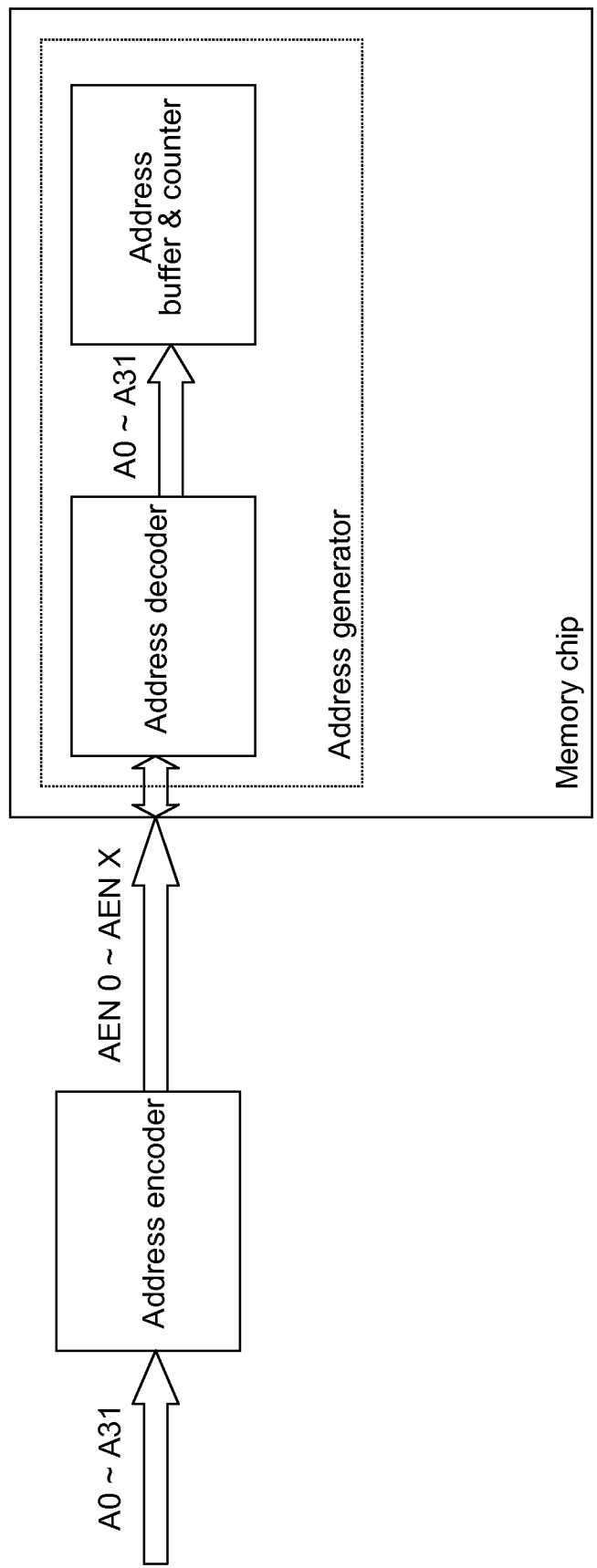
FIG. 4 is a block diagram of a memory chip including an address decoder, and an off-memory chip address encoder, such that the off-memory chip address encoder encodes the memory address into a shorter address representation, and the on-memory chip address decoder restores the longer address representation used for general on-memory chip operation, from the shorter address representation.

FIG. 1A is a memory instruction with a memory access operation code and a 3 byte address. FIG. 1A shows a common command and address input sequence for memory such as serial flash memory. Following by the operation code, the address bits are input sequentially from A23 to A0 which denotes 2^24 addresses of 1 byte (2^3 bits) of data, for a total memory storage of 16 megabytes. Accordingly, for a memory capacity larger than 16 megabytes, the address load cycle is insufficient, and extra address load cycles for higher addresses are necessary.

FIG. 1B is a memory instruction with a memory access operation code and a 4 byte address. FIG. 1A shows another command and address input sequence for memory such as serial flash memory. In FIG. 1B, an additional byte, with address bits A31 to A24, precedes the address bits A23 to A0. Although the memory instruction of FIG. 1B includes more address bits, and consequently can access a memory capacity larger than the memory instruction of FIG. 1A. However, the additional address byte of FIG. 1B changes the duration and timing of the command. Without modification, applications which depend on the instruction of FIG. 1A may not work with the instruction of FIG. 1B.

FIG. 2A is a memory instruction with a memory access operation code specifying single word access, and one bit address specifying two bytes of data (single word). Because an entire word is accessed based on the address, 1 potential address bit corresponding to the locations of the 16 different bits in a single word have been eliminated from the address, reducing the number of address input cycles and address load cycles.

FIG. 2B is a memory instruction with a memory access operation code specifying double word access, and two address bits specifying four bytes of data (double word). As with FIG. 2A for single word access, one potential address bit corresponding to the locations of the 16 different bits in a single word have been eliminated from the address, reducing the number of address input cycles and address load cycles. An additional 2nd bit is eliminated, because 2 words are accessed instead of a single word.

FIG. 2C is a memory instruction with a memory access operation code for the quadruple word access, and 3 address bits specifying the specifying the address for the quadruple word access. As with FIG. 2A for single word access, one potential address bit corresponding to the locations of the 16 different bits in a single word have been eliminated from the address, reducing the number of address input cycles and address load cycles. Additional 2nd and 3rd bits are eliminated, because 4 words are accessed instead of a single word.

FIG. 3A is a memory instruction with a memory access operation code to specify a high order address, and a single byte address and two don't care bytes specifying the high order address portion of a complete memory address.

In contrast with FIG. 1B, which modifies the memory access command to specify more address bits, FIG. 3A has an entirely separate instruction with a distinct high address operation code and a high address, in order to exceed the standard address input space. Accordingly, a user issues two different input commands to completely specify a memory address, and access the memory array. The high address command and low address command have different command codes for identifying high order and low order addresses. However, subsequent accesses can assume that the high address of a prior high address instruction remains in effect, reducing the number of input commands to one input command, for future memory accesses with the same high address.

FIG. 3B is a memory instruction with a memory access operation code to specify a low memory address. Although FIG. 3B resembles FIG. 1A, the memory access instruction of FIG. 1A is not reliant on a separate high memory address instruction. In contrast, the memory access instruction of FIG. 3B relies on the high memory address instruction of FIG. 3A.

FIG. 4 is a block diagram of a memory chip including an address decoder, and an off-memory chip address encoder, such that the off-memory chip address encoder encodes the memory address into a shorter address representation, and the on-memory chip address decoder restores the longer address representation used for general on-memory chip operation, from the shorter address representation.

The hardware implementation of FIG. 4 encodes the address information before serial input to the memory chip. The hardware encoder encodes the address information to have a length of X bits, which depends on the particular compression algorithm of the encoder. Because the encoded address information of length X is shorter than the unencoded address, the fewer address load cycles are needed. During the address load cycles, the internal address generator of the memory chip decodes the encoded address information and sends the decoded address to the address buffer and counter used for internal chip operation.

Figures 5A, 5B:
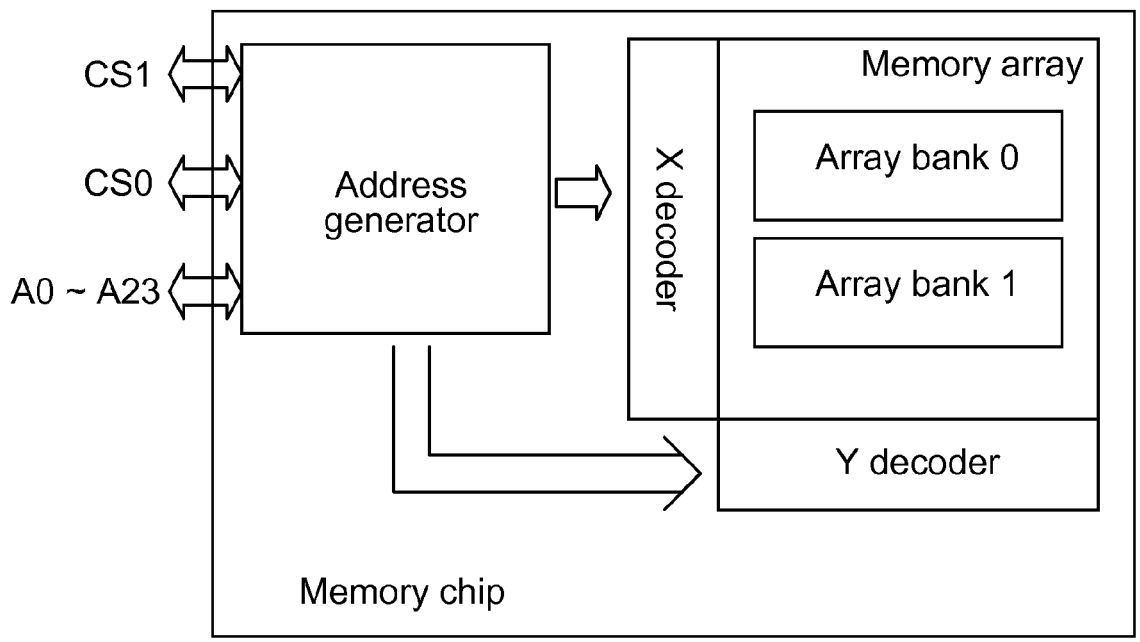
FIG. 5A is a block diagram of a memory chip with multiple array memory array banks, a set of pins serially communicating a low memory address, and another set of pins communicating a high memory address.
FIG. 5B is a sample table that decodes the set of pins communicating a high memory address in FIG. 5A, with various high memory address functions.

FIG. 5A is a block diagram of a memory chip with multiple memory array banks, a set of pins serially communicating a low memory address, and another set of pins communicating a high memory address. FIG. 5B is a sample table that decodes the set of pins communicating a high memory address in FIG. 5A, with various high memory address functions.

FIGS. 5A and 5B are an example of a more general technology of communicating addresses by utilizing unused input pins, output pins, or I/O pins to indicate the memory address. The CS0 and CS1 pins denote select input pins for the array bank0 and array bank1. These two array banks can be continuous access, such that after reaching the last address of bank0, the internal address counter jumps to the first address bank1 for the next read cycle, and subsequently loops array bank0, array bank1, or the whole array including array bank0 and array bank1, depending on the corresponding setting of the CS[1:0] select pin combination shown in FIG. 5B.

Figure 6:
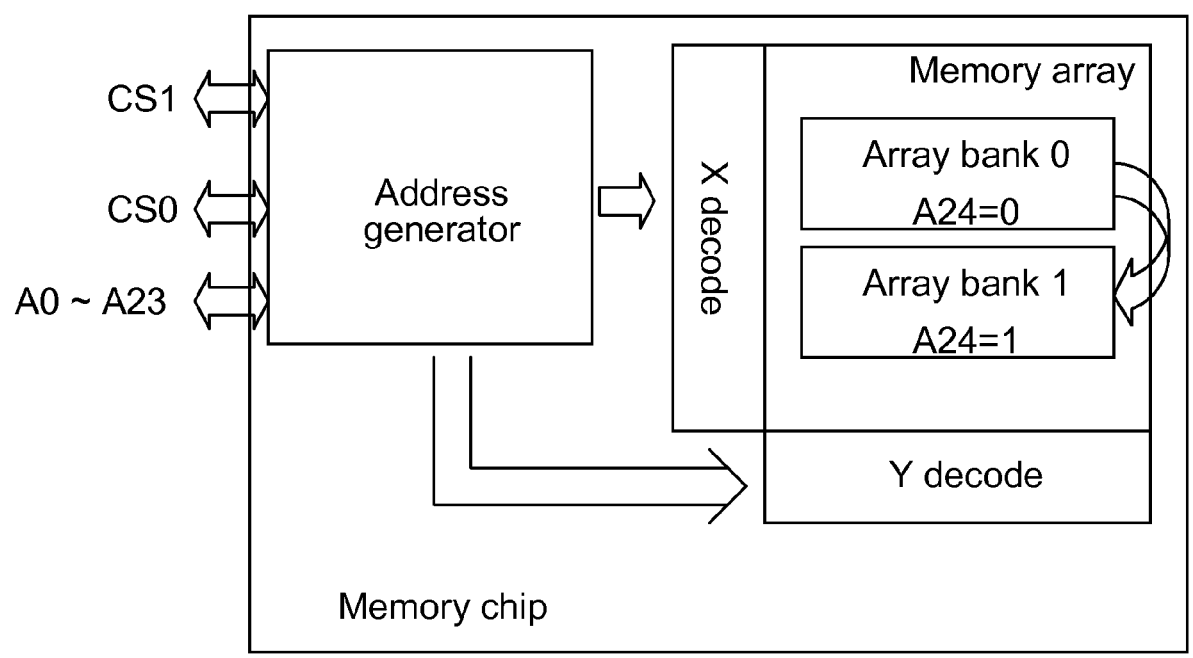
FIG. 6 is a block diagram of a memory chip with multiple memory array banks, a set of pins serially communicating a low memory address, and another set of pins communicating a high memory address.

FIG. 6 is a block diagram of a memory chip with multiple memory array banks, a set of pins serially communicating a low memory address, and another set of pins communicating a high memory address.

FIG. 6 shows another method that addresses with a number of address bits higher than A23 will be initially set to "0" if and only if the user attempt to access the first 128 Mb array bank0 area (A24=0). Then the chip will sequentially count to the next address (A24=1) when the first 128 Mb array boundary is reached.

Figure 7:
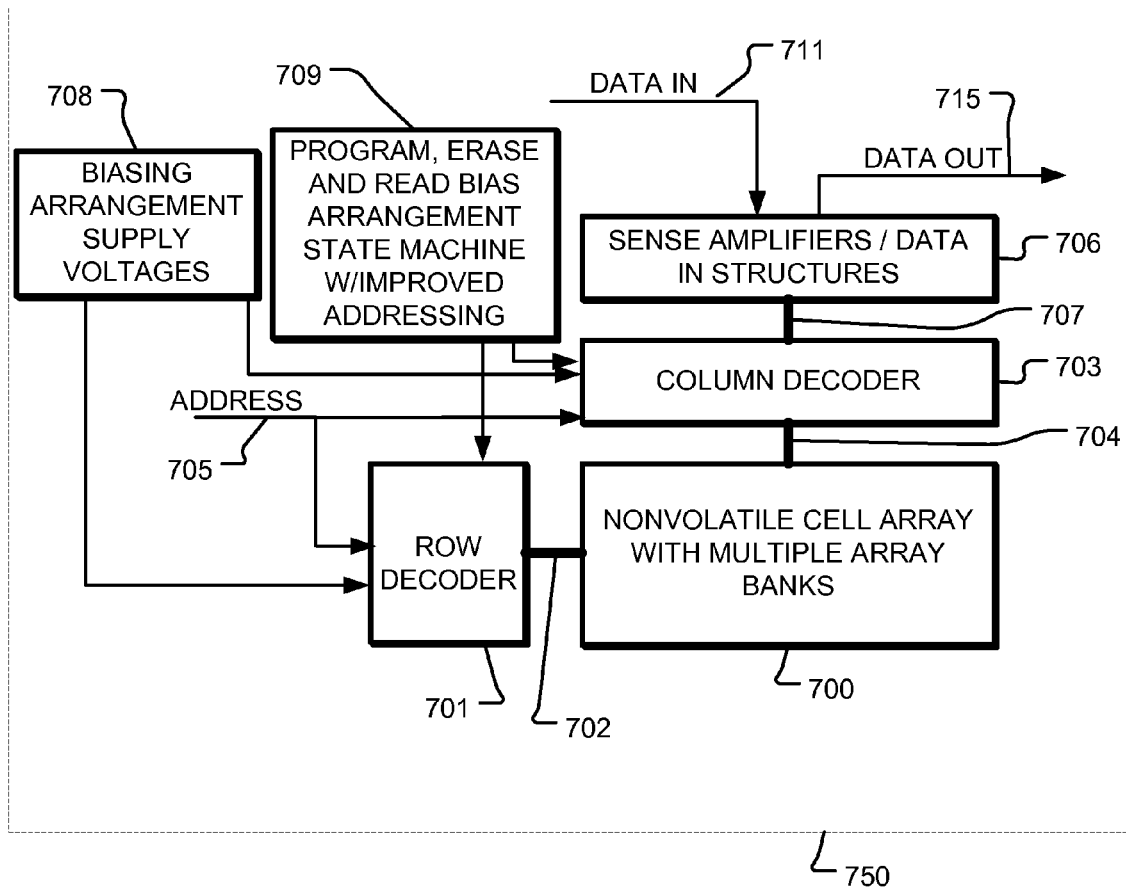
FIG. 7 is a simplified block diagram of a memory integrated circuit multiple memory banks, that implements an improved addressing scheme as disclosed herein.

FIG. 7 is a simplified block diagram of a memory integrated circuit multiple memory banks, that implements an improved addressing scheme as disclosed herein.

The simplified block diagram of an integrated circuit 750 includes a memory array 700. A word line (or row) and block select decoder 701 is coupled to, and in electrical communication with, a plurality 702 of word lines and string select lines, and arranged along rows in the memory array 700 which includes multiple groups of memory cells. A bit line (column) decoder and drivers 703 are coupled to and in electrical communication with a plurality of bit lines 704 arranged along columns in the memory array 700 for reading data from, and writing data to, the memory cells in the memory array 700. Addresses are supplied on bus 705 to the word line decoder and drivers 701 and to the bit line decoder 703. Sense amplifiers and data-in structures in block 706, including current sources for the read, program and erase modes, are coupled to the bit line decoder 703 via the bus 707. Data is supplied via the data-in line 711 from input/output ports on the integrated circuit 750, to the data-in structures in block 706. Data is supplied via the data-out line 715 from the sense amplifiers in block 706 to input/output ports on the integrated circuit 750, or to other data destinations internal or external to the integrated circuit 750. State machine and improved addressing circuitry are in circuitry 709, and controlling biasing arrangement supply voltages 708 both couple to row decoder 701 and column decoder 703 respectively.

The memory addressing approaches disclosed herein can be implemented by modifying an SPI flash memory.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
   an input receiving a memory command for the memory array, the memory command including an encoded memory address; and
   control circuitry accessing the memory array on the integrated circuit, comprising:
   an address decoder receiving the encoded memory address and generating a decoded memory address from the encoded memory address, wherein the decoded memory address is longer than the encoded memory address; and
   the memory array.

2. The circuit of claim 1, wherein the memory command is sent from a location off of the integrated circuit.

3. The circuit of claim 1, wherein the encoded memory address is encoded at a location off of the integrated circuit.

4. The circuit of claim 1, wherein the memory command includes an operation code and the encoded memory address.

5. The circuit of claim 1, wherein the memory array is addressable by the decoded memory address and not addressable by the encoded memory address.

6. The circuit of claim 1, wherein the decoded memory address is associated with a communication duration of fewer address load cycles than the encoded memory address.

7. The circuit of claim 1, wherein the decoded memory address is associated with a serial communication duration of fewer address load cycles than the encoded memory address.

8. A method, comprising:
   receiving a memory command for a memory array in an integrated circuit, the memory command including an encoded memory address;
   decoding, in the integrated circuit, the encoded memory address and generating a decoded memory address from the encoded memory address, wherein the decoded memory address is longer than the encoded memory address; and
   accessing the memory array in the integrated circuit with the decoded memory address.

9. The method of claim 8, wherein the memory command is sent from a location off of the integrated circuit.

10. The method of claim 8, wherein the encoded memory address is encoded at a location off of the integrated circuit.

11. The method of claim 8, wherein the memory command includes an operation code and the encoded memory address.

12. The method of claim 8, wherein the memory array is addressable by the decoded memory address and not addressable by the encoded memory address.

13. The method of claim 8, wherein the decoded memory address is associated with a communication duration of fewer address load cycles than the encoded memory address.

14. The method of claim 8, wherein the decoded memory address is associated with a serial communication duration of fewer address load cycles than the encoded memory address.

15. An integrated circuit, comprising:
    a plurality of memory banks;
    a first input receiving a plurality of memory address bits identifying a memory location within each memory bank of multiple memory banks of the plurality of memory banks;
    a second input receiving at least one control signal that identifies a particular memory bank of the plurality of memory banks that is addressed by the first input; and
    control circuitry accessing the memory array on the integrated circuit, comprising:
    an address decoder receiving the first input and the second input and accessing the particular memory bank at the memory location.

16. The circuit of claim 15, wherein the second input identifies a next memory bank of the plurality of memory banks that is accessed, responsive to a last address being accessed with the particular memory bank.

17. The circuit of claim 16, wherein the next memory bank and the particular memory bank are different memory banks of the plurality of memory banks 18. The circuit of claim 16, wherein the next memory bank and the particular memory bank are different memory banks of the plurality of memory banks, and the second control signal instructs looping between the different memory banks 19. An integrated circuit, comprising:
   a plurality of memory cells divided into a plurality of banks;
   a first set of one or more pins that receive a signal indicating a set of low order memory address bits; and
   a second set of one or more pins that receive a signal indicating a set of high order memory address bits, the set of low order memory address bits and the set of high order memory address bits in combination identifying memory cells to access, wherein the set of high order memory address bits indicate the addresses of a bank to distinguish the bank from at least one other bank.

20. The circuit of claim 19, wherein the set of high order memory address bits indicate the addresses of a bank.

* * * * *

UNITED STATES PATENT AND TRADEMARK OFFICE
CERTIFICATE OF CORRECTION

PATENT NO. : 8,599,640 B2  
APPLICATION NO. : 13/708150  
DATED : December 3, 2013  
INVENTOR(S) : Chun-Hsiung Hung, Kuen-Long Chang and Hsieh Ming Chih Page 1 of 1

It is certified that error appears in the above-identified patent and that said Letters Patent is hereby corrected as shown below:

In the Claims

In claim 17, column 8, line 66, at the end of the sentence after the word "banks", insert a -- . --.

In claim 18, column 9, line 4, at the end of the sentence after the word "banks", insert a -- . --.

Signed and Sealed this  
Third Day of February, 2015

Michelle K. Lee  
*Deputy Director of the United States Patent and Trademark Office*